(12) United States Patent
Cheng et al.

(10) Patent No.: US 10,256,608 B2
(45) Date of Patent: Apr. 9, 2019

(54) RESONANT CAVITY STRAINED GROUP III-V PHOTODETECTOR AND LED ON SILICON SUBSTRATE AND METHOD TO FABRICATE SAME

(71) Applicant: International Business Machines Corporation, Armonk, NY (US)

(72) Inventors: Cheng-Wei Cheng, White Plains, NY (US); Effendi Leobandung, Stormville, NY (US); Ning Li, White Plains, NY (US); Devendra K. Sadana, Pleasantville, NY (US); Kuen-Ting Shiu, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/810,629

(22) Filed: Nov. 13, 2017

(65) Prior Publication Data

US 2018/0069376 A1    Mar. 8, 2018

Related U.S. Application Data

(62) Division of application No. 15/249,614, filed on Aug. 29, 2016, now Pat. No. 10,122,153.

(51) Int. Cl.
*H01L 31/105* (2006.01)
*H01S 5/183* (2006.01)
(Continued)

(52) U.S. Cl.
CPC .... *H01S 5/18377* (2013.01); *H01L 31/02327* (2013.01); *H01L 31/0304* (2013.01);
(Continued)

(58) Field of Classification Search
CPC .......... H01S 5/183; H01S 5/343; H01S 5/187; H01L 33/10; H01L 33/12; H01L 33/30;
(Continued)

(56) References Cited

U.S. PATENT DOCUMENTS

| | | |
|---|---|---|
| 5,389,797 A | 2/1995 | Bryan et al. |
| 6,618,410 B1 | 9/2003 | Fischer |

(Continued)

FOREIGN PATENT DOCUMENTS

CN    103579902 A    2/2014

OTHER PUBLICATIONS

Unlu et al., "Resonant Cavity Enhanced AlGaAs/GaAs Heterojunction Phototransistors with an Intermediate InGaAs Layer in the Collector", Appl. Phys. Lett. 57(8) Aug. 20, 1990, American Institute of Physics.

(Continued)

*Primary Examiner* — Asok K Sarkar
*Assistant Examiner* — Dmitriy Yemelyanov
(74) *Attorney, Agent, or Firm* — Harrington & Smith

(57) ABSTRACT

A structure includes an optoelectronic device having a Group IV substrate (e.g., Si); a buffer layer (e.g. SiGe) disposed on the substrate and a first distributed Bragg reflector (DBR) disposed on the buffer layer. The first DBR contains alternating layers of doped Group IV materials (e.g., alternating layers of $Si_yGe_{(1-y)}$, where $0.8<y<1$, and $Si_zGe_{(1-z)}$, where $0.2<z<0.4$) that are substantially transparent to a wavelength of interest. The structure further includes a strained layer of a Group III-V material over the first DBR and a second DBR over the strained layer. The second DBR contains alternating layers of electrically conductive oxides (e.g., ITO/AZO) that are substantially transparent to the wavelength of interest. Embodiments of VCSELs and photodetectors can be derived from the structure. The strained (Continued)

layer of Group III-V material can be, for example, a thin layer of $In_{0.53}Ga_{0.47}As$ having a thickness in a range of about 2 nm to about 5 nm.

20 Claims, 5 Drawing Sheets

(51) Int. Cl.
<table>
<tr><td>H01L 33/10</td><td>(2010.01)</td></tr>
<tr><td>H01L 33/12</td><td>(2010.01)</td></tr>
<tr><td>H01L 33/30</td><td>(2010.01)</td></tr>
<tr><td>H01L 31/0304</td><td>(2006.01)</td></tr>
<tr><td>H01L 31/0232</td><td>(2014.01)</td></tr>
<tr><td>H01L 33/00</td><td>(2010.01)</td></tr>
<tr><td>H01S 5/343</td><td>(2006.01)</td></tr>
<tr><td>H01S 5/187</td><td>(2006.01)</td></tr>
<tr><td>H01L 31/18</td><td>(2006.01)</td></tr>
<tr><td>H01S 5/02</td><td>(2006.01)</td></tr>
<tr><td>H01S 5/026</td><td>(2006.01)</td></tr>
</table>

(52) U.S. Cl.
CPC ........ *H01L 31/105* (2013.01); *H01L 31/1852* (2013.01); *H01L 33/0012* (2013.01); *H01L 33/0066* (2013.01); *H01L 33/105* (2013.01); *H01L 33/12* (2013.01); *H01L 33/30* (2013.01); *H01S 5/021* (2013.01); *H01S 5/0218* (2013.01); *H01S 5/187* (2013.01); *H01S 5/18361* (2013.01); *H01S 5/3432* (2013.01); *H01S 5/34366* (2013.01); *H01S 5/0262* (2013.01)

(58) Field of Classification Search
CPC ............. H01L 31/0304; H01L 31/0232; H01L 31/105; H01L 33/00; H01L 31/18
See application file for complete search history.

(56) References Cited

U.S. PATENT DOCUMENTS

<table>
<tr><td>6,677,655 B2</td><td>1/2004</td><td>Fitzergald</td></tr>
<tr><td>6,878,958 B2</td><td>4/2005</td><td>Zhu</td></tr>
<tr><td>7,324,574 B2</td><td>1/2008</td><td>Kim</td></tr>
<tr><td>7,588,954 B2</td><td>9/2009</td><td>Von Kaenel et al.</td></tr>
<tr><td>8,029,905 B2</td><td>10/2011</td><td>Kouvetakis et al.</td></tr>
<tr><td>8,882,909 B2</td><td>11/2014</td><td>Von Kaenel</td></tr>
<tr><td>9,337,622 B2</td><td>5/2016</td><td>Ma et al.</td></tr>
<tr><td>2005/0110026 A1*</td><td>5/2005</td><td>Plaine .................. H01L 27/15<br>257/80</td></tr>
<tr><td>2007/0127535 A1</td><td>6/2007</td><td>Kim</td></tr>
</table>

OTHER PUBLICATIONS

Groenert et al., "Monolithic Integration of Room-Temperature cw GaAs/AlGaAs Layers on Si Substrates Via Relaxed Graded GeSi Buffer Layers", Journal of Applied Physics, vol. 93, No. 1, Jan. 1, 2003.

List of IBM Patents or Patent Applications Treated as Related, 2 pgs.

* cited by examiner

RESONANT CAVITY STRAINED GROUP III-V PHOTODETECTOR AND LED ON SILICON SUBSTRATE AND METHOD TO FABRICATE SAME

CROSS REFERENCE TO RELATED APPLICATION

This patent application is a divisional patent application of copending U.S. patent application Ser. No. 15/249,614, filed Aug. 29, 2016, the disclosure of which is incorporated by reference herein in its entirety.

TECHNICAL FIELD

The various embodiments of this invention relate generally to optoelectronic solid state semiconductor devices and fabrication techniques and, more specifically, relate to light emitting diodes (LEDs) and photodetectors (PDs) containing semiconductor materials and to the fabrication of such devices, and even more specifically relate to vertical cavity surface emitting lasers (VCSELs) and resonant cavity PD devices.

BACKGROUND

Group III elements include Al, Ga and In; Group IV elements include C, Si and Ge; Group V elements include P, As and Sb. For Group III-V based optoelectronics such as lasers, LEDs and PDs, on Group IV (e.g., Si) substrates relatively thick layers (e.g., >1 µm) of Group III-V material are needed to compensate for the typically high defect density at the interface of Group IV and Group V material systems. It can be disadvantageous both time-wise and expense-wise to epitaxially deposit such relatively thick layers.

SUMMARY

In a first aspect thereof the embodiments of this invention provide a structure that comprises an optoelectronic device, comprising a substrate that comprises a Group IV semiconductor material; a buffer layer disposed on the substrate; a first distributed Bragg reflector (DBR) disposed on the buffer layer, the first DBR comprised of alternating layers of doped Group IV materials that are substantially transparent to a wavelength of interest; a strained layer disposed over the first DBR, the strained layer being comprised of a Group III-V material; and a second DBR disposed over the strained layer, the second DBR comprised of alternating layers of electrically conductive oxides that are substantially transparent to the wavelength of interest.

In another aspect thereof the embodiments of this invention provide a method that comprises providing a substrate that comprises a Group IV semiconductor material; epitaxially depositing a buffer layer on a surface of the substrate; depositing alternating layers of doped Group IV materials on the buffer layer to form a first distributed Bragg reflector (DBR) on the buffer layer, the alternating layers of doped Group IV materials being substantially transparent to a wavelength of interest; depositing a strained layer comprised of a Group III-V material over the first DBR; and depositing alternating layers of electrically conductive oxides over the strained layer to form a second DBR over the strained layer, the alternating layers of electrically conductive oxides being substantially transparent to the wavelength of interest.

BRIEF DESCRIPTION OF THE SEVERAL VIEWS OF THE DRAWINGS

FIG. 1 depicts an enlarged cross-sectional view of a conventional Group III-V based VCSEL;

FIG. 2 is an enlarged cross-sectional view of a VCSEL that is constructed in accordance with embodiments of this invention to include a Group III-V light emitting layer in a resonant cavity structure on a Si substrate;

FIG. 3 is an enlarged cross-sectional view of a resonant cavity PD that is constructed in accordance with embodiments of this invention to include a Group III-V light absorption layer in a resonant cavity structure on a Si substrate; and FIG. 4 is an enlarged cross-sectional view of a combination of the VCSEL of FIG. 2 and the resonant cavity PD of FIG. 3 on a common Si substrate.

DETAILED DESCRIPTION

Figure 1:
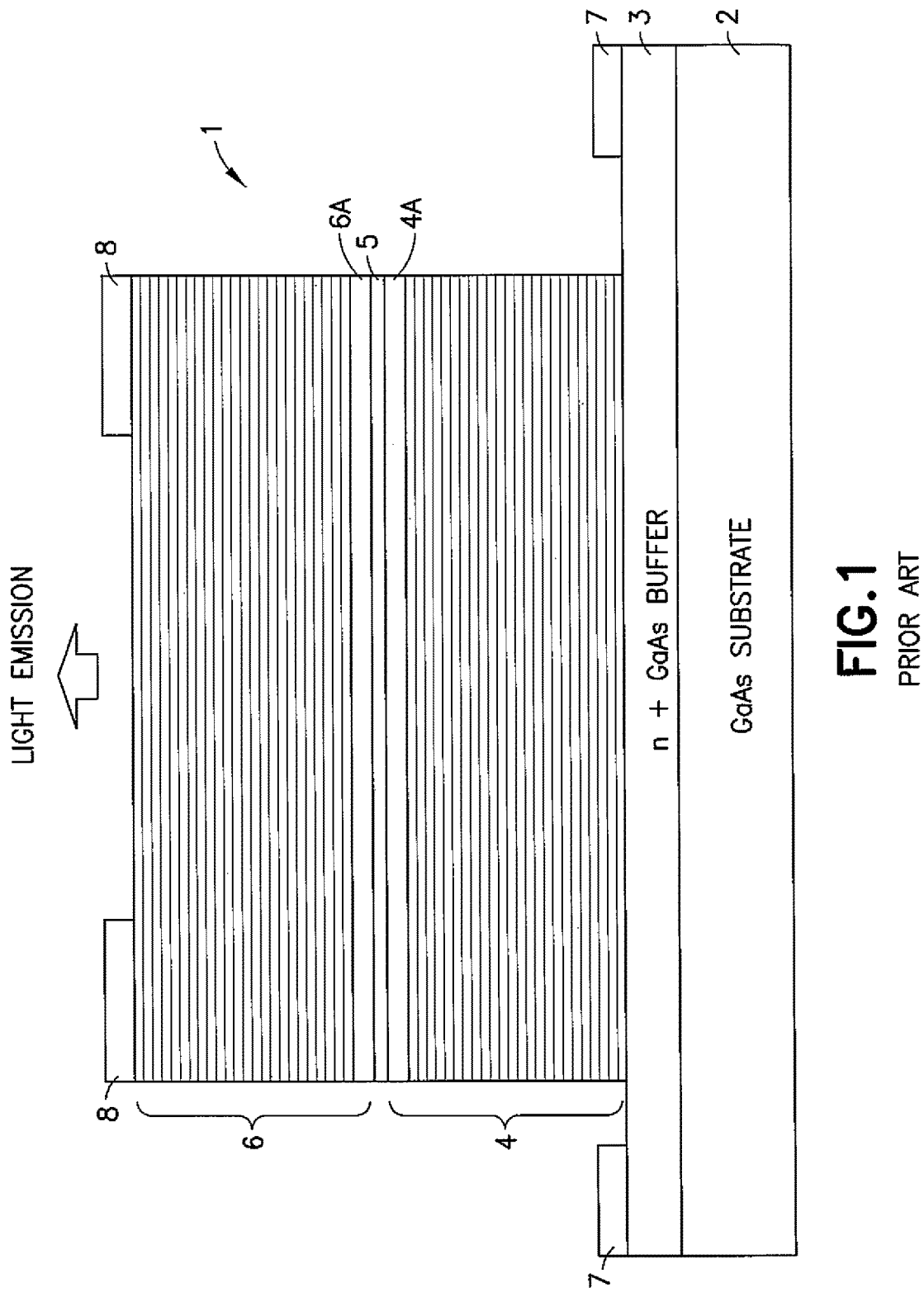
FIGS. 1-4 are each an enlarged cross-sectional view wherein the various layer thicknesses and other dimensions are not necessarily drawn to scale. More specifically.

The word "exemplary" is used herein to mean "serving as an example, instance, or illustration." Any embodiment described herein as "exemplary" is not necessarily to be construed as preferred or advantageous over other embodiments. All of the embodiments described in this Detailed Description are exemplary embodiments provided to enable persons skilled in the art to make or use the invention and not to limit the scope of the invention which is defined by the claims.

The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a <100> crystal surface will take on a <100> orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses and methods that are suitable for use in implementing the embodiments of this invention can include, but are not limited to, chemical vapor deposition (CVD) such as, for example, rapid thermal chemical vapor deposition (RTCVD), atmospheric pressure chemical vapor deposition (APCVD), low pressure chemical vapor deposition (LP-CVD) and ultra-high vacuum chemical vapor deposition (UHVCVD). Other suitable epitaxial growth processes can include, but are not limited to, molecular beam epitaxy (MBE) and low-energy plasma deposition (LEPD). The temperature for an epitaxial deposition process typically ranges from about 300° C. to about 900° C. Although higher temperature will typically result in faster deposition of the semiconductor material, the faster deposition may also result in crystal defects and film cracking.

Unless expressly indicated differently any references to a "top surface" herein imply a surface in a direction away from some surface that would support a substrate, while any references to a "bottom surface" imply a surface in a direction towards the surface that would support the substrate.

A distributed Bragg reflector (DBR) is a well-known type of structure that can be formed from multiple layers of alternating materials with different values of refractive index. This structure results in a periodic variation in the effective refractive index. Each layer boundary causes a partial reflection of an optical wave. For those waves whose vacuum wavelength is about four times the optical thickness of the layers the multiple reflections combine with constructive interference and the layers thus function as a high-quality reflector.

The embodiments of this invention use only a relatively thin layer of a strained Group III-V material (e.g., a 2 nm-5 nm thick InGaAs layer) in a resonant cavity structure defined by a combination of an electrically conductive first DBR comprised of alternating transparent layers of, for example, Si and SiGe (more specifically alternating Group IV layers of $Si_yGe_{(1-y)}$, where $0.8<y<1$, and $Si_zGe_{(1-z)}$, where $0.2<z<0.4$) and an electrically conductive second DBR comprised of an oxide such as alternating transparent layers of Indium Tin Oxide (ITO) and Al doped ZnO (AZO or Al:ZnO). The ITO can be composed of, as one non-limiting example, 74% In, 18% $O_2$, and 8% Sn by weight. The Al doping concentration in the Al:ZnO can be in a range of about 0.5% to about 5%, with about 4% being one suitable nominal value. Using the thin layer of strained Group III-V material on a lattice mismatched Si substrate the photodetection and light emission capabilities can be extended to longer wavelengths. The presence of the resonant cavity aids in enhancing the photodetection and light emission characteristics using the thin layer of strained Group III-V material, which can be grown free of defects on Si.

In order to place this invention in a proper technological context reference is first made to FIG. 1 for showing an enlarged cross-sectional view of a conventional Group III-V based VCSEL 1. The conventional VCSEL 1 includes a GaAs substrate 2 and an overlying layer n+ GaAs buffer layer 3. Disposed on the buffer layer 3 is a bottom n-type doped DBR 4 composed of alternating thin layers (nominally one quarter wavelength ($\lambda/4$) thick) of GaAs and AlGaAs. Disposed on the bottom DBR 4 is a strained InGaAs quantum well (QW) light emitting layer 5 and disposed on the QW light emitting layer 5 is a top p-type doped DBR 6 also composed of alternating thin layers (nominally $\lambda/4$ thick) of GaAs and AlGaAs. In a typical embodiment whatever layer 4A (GaAs or AlGaAs) that lies beneath and supports the QW light emitting layer 5 is made somewhat thicker, and a complementary AlGaAs or GaAs thicker layer 6A of the top DBR is disposed on top of the QW light emitting layer 5. The VCSEL 1 is electrically connected to one or more n-contacts 7 (via the buffer layer 3) and p-contacts 8. The VCSEL structure as shown can be considered as a p-intrinsic-n (P-I-N) diode where the bottom n-type doped DBR 4 functions as a cathode, the top p-type doped DBR 6 functions as an anode, and the QW light emitting layer 5 functions as the intrinsic (I) layer.

In the example depicted of the conventional VCSEL 1 the refractive index of the DBR materials are GaAs:3.6 and $Al_{0.9}Ga_{0.1}As$:3.1. In this case the refractive index contrast=3.6/3.1=1.16.

Figure 2:
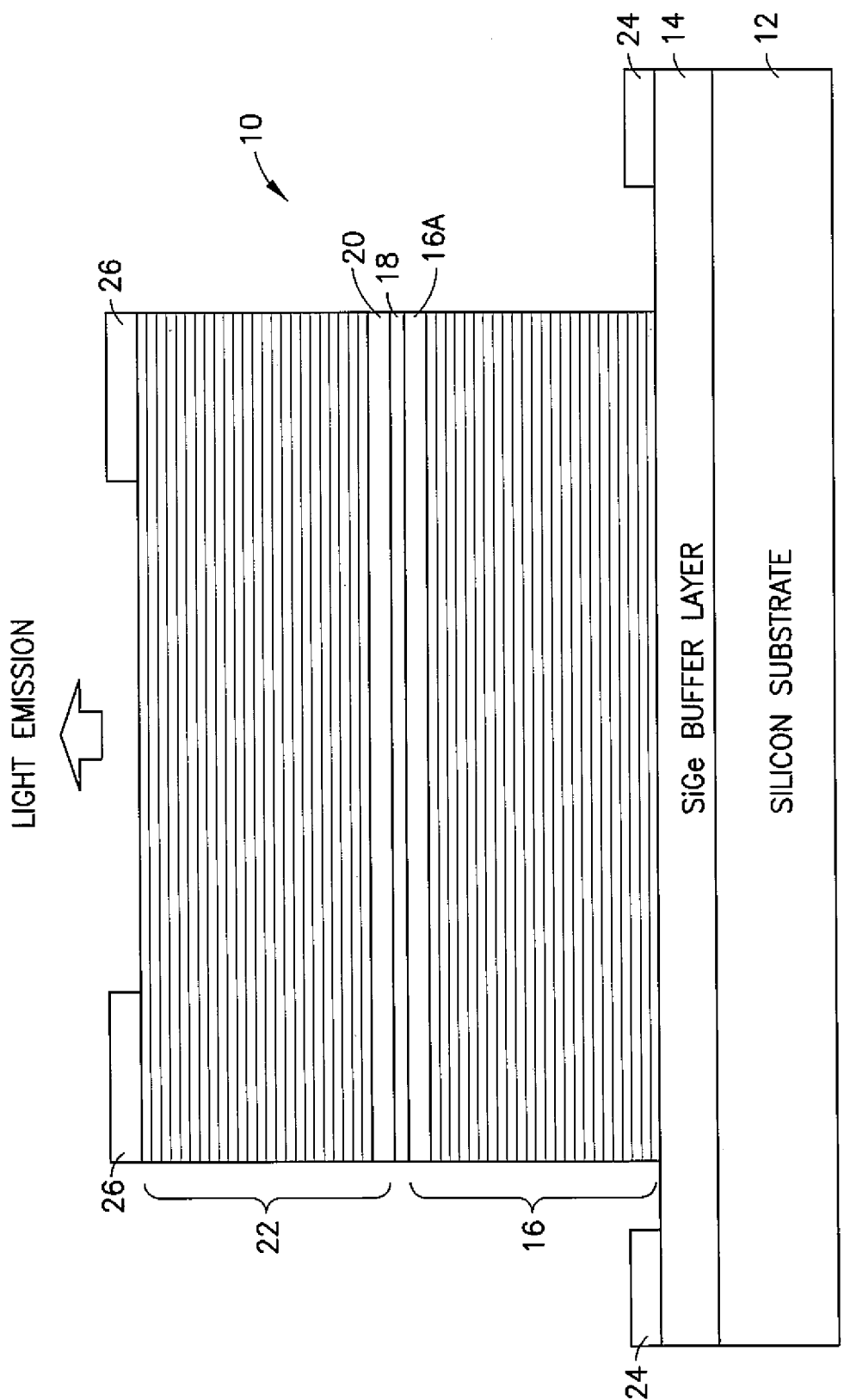

FIG. 2 is an enlarged cross-sectional view of a VCSEL 10 that is constructed in accordance with embodiments of this invention. It is noted at the outset that the material compositions, numbers of layers, layer thicknesses and the like that are shown and described can vary based on intended design parameters and requirements. In this non-limiting embodiment the desired emission wavelength is a communication-compatible wavelength in a range of about 1.3 μm to about 1.65 μm and the material compositions and layer thicknesses and numbers of layers are set accordingly.

In this non-limiting embodiment the VCSEL 10 includes a Si substrate 12 (e.g., a <100> Si substrate) having any suitable thickness. Disposed on the Si substrate 12 is a relaxed SiGe (e.g., $Si_xGe_{1-x}$, where $0.5<x<0.7$) buffer layer 14 having a thickness in a range of about 100 nm to about 1000 nm. Disposed on the buffer layer 14 is a strain compensated p-type doped bottom DBR 16 composed of alternating Group IV layers of $Si_yGe_{(1-y)}$, where $0.8<y<1$, and $Si_zGe_{(1-z)}$, where $0.2<z<0.4$. In this non-limiting embodiment each of the layers of the bottom DBR 16 can have a thickness in a range of about 80 nm to about 150 nm and there can be about 20 to about 35 pairs of the alternating Group IV layers of $Si_yGe_{(1-y)}$ and $Si_zGe_{(1-z)}$. The bottom DBR 16 can be in situ doped p-type using, for example, Boron with a dopant concentration in an exemplary range of about $10^{18}$ to about $10^{19}$ atoms/cm$^3$. A top-most $Si_yGe_{(1-y)}$ or $Si_zGe_{(1-z)}$ layer forms a nominally thicker cap layer 16A.

Disposed on the cap layer 16A is, in this non-limiting embodiment, a strained InGaAs (e.g., $In_{0.53}Ga_{0.47}As$) light emitting QW layer 18 having a thickness in a range of about 2 nm to about 5 nm and a bandgap=0.75 eV. The InGaAs layer 18 is strained as it is grown directly on the Si or SiGe cap layer 16A. In other embodiments of the invention the QW Group III-V layer 18 can be composed of, as several non-limiting examples, binary Group III-V materials such as InAs or InSb, a ternary Group III-V material such as the layer 18 of $In_xGa_{(1-x)}As$, where x is between 0.1 and 0.8, or a quaternary Group III-V material such as, for example, InGaAsP.

In FIG. 2 the InGaAs layer 18 functions as a light emitting layer since in the final device it is operated as a forward biased p-n or p-i-n junction. In the photodetector embodiment described below in relation to FIG. 3 the InGaAs layer 18 functions as a light absorbing layer since in the final device it is operated as a p-n or p-i-n reverse biased junction.

Disposed on a top surface of the Group III-V light emitting layer 18 is a Group III-V surface passivation layer 20 that, in this non-limiting embodiment, is embodied as a relative thin (e.g., about 100 nm to about 300 nm) GaAs layer.

Disposed on a top surface of the Group III-V surface passivation layer 20 is an electrically conductive oxide top DBR 22 that, in this non-limiting embodiment, is embodied as an ITO/Al:ZnO layer stack. In other embodiments the top DBR 22 could contain, for example, electrically conductive oxide layers of $TiO_2$ or $SnO_2$:F. Sputtering and atomic layer deposition (ALD) are two exemplary methods of depositing the electrically conductive oxide top DBR 22. The index of refraction of the top DBR 22 is less than the index of refraction of the bottom DBR 16 and it can contain, for example, about 15 to about 25 pairs of ITO and Al:ZnO layers, where each of these layers has a thickness in a range of about 150 nm to about 300 nm. There can be p-contacts 24 coupled to the bottom DBR 16 via the electrically conductive buffer layer 14 and n-contacts 26 coupled to the top DBR 22. One or both of the contacts 24, 26 could be ring-shaped contacts. The contacts 24 and 26 are connected during use to an operating voltage potential (e.g., in a range of about 1.0V to about 1.5V). During operation light emission in the exemplary range of about 1.3 μm~1.65 μm is directed vertically upwards from the top surface of the top DBR 22. The combination of the layers 16A, 18 and 20, or at least layers 18 and 20, can be considered as embodying an intrinsic region in a P-I-N light emitting diode.

The bottom distributed feedback reflector (DBR) 16, composed of the alternating Group IV layers of $Si_yGe_{(1-y)}$ and $Si_zGe_{(1-z)}$ material, in one non-limiting embodiment if the invention exhibits a refractive index of; e.g., Si:3.4 and $Si_{0.2}Ge_{0.8}$:4.1 and thus has a refractive index contrast equal to 4.1/3.4=1.21, a value that is beneficially greater than the value of 1.16 for the conventional GaAs/AlGaAs DBR 4 shown in FIG. 1.

The bottom DBR 16 composed of the alternating Group IV layers of $Si_yGe_{(1-y)}$ and $Si_zGe_{(1-z)}$ and the top ITO/AZO DBR 22 are both substantially transparent to light having a wavelength of interest, e.g., light having a wavelength in a range of about 1.3 μm~1.65 μm in this non-limiting example.

Figure 3:
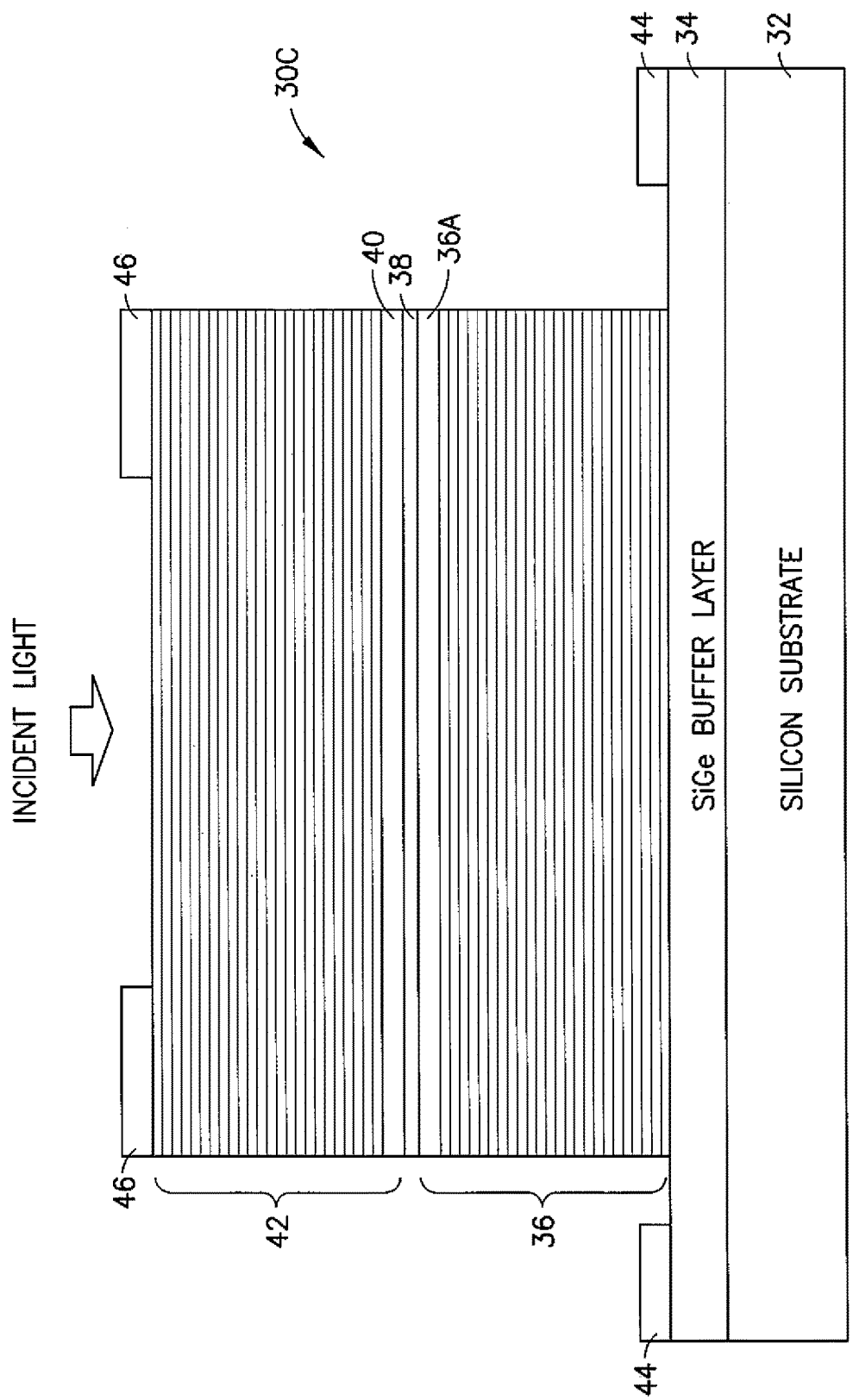

FIG. 3 is an enlarged cross-sectional view of a resonant cavity photodetector (PD) 30 that is constructed in accordance with embodiments of this invention. As with the VCSEL 10 the material compositions, numbers of layers, layer thicknesses and the like that are shown and described can vary based on intended design parameters and requirements. In this non-limiting embodiment the desired absorption wavelength is again the communication-compatible wavelength in a range of about 1.3 μm~1.65 μm and the material compositions and layer thicknesses and numbers of layers are set accordingly.

It will be appreciated that the overall fabrication details and the resultant structure of the resonant cavity PD 30 can be the same or very similar to that of the VCSEL 10 of FIG. 1. One possible distinction is that the optical requirements of the PD DBR can be somewhat less than those of the VCSEL DBR.

With this in mind, in this non-limiting embodiment the resonant cavity PD 30 includes a Si substrate 32 (e.g., a <100> Si substrate) having any suitable thickness. It will be shown with respect to FIG. 4 that the Si substrate 32 can be the same substrate as the Si substrate 12 of FIG. 2. Disposed on the Si substrate 32 is, in one non-limiting embodiment, a relaxed $Si_xGe_{1-x}$, where 0.5<x<0.7, buffer layer 34 having a thickness in a range of about 100 nm to about 1000 nm. Disposed on the buffer layer 34 is a strain compensated p-type doped bottom DBR 36 composed, in one non-limiting embodiment, of alternating Group IV layers of $Si_yGe_{(1-y)}$, where 0.8<y<1, and $Si_zGe_{(1-z)}$, where 0.2<z<0.4. In this non-limiting embodiment each of the layers of the bottom DBR 36 can have a thickness in a range of about 80 nm to about 150 nm and there can be about 20 to about 35 pairs of the $Si_yGe_{(1-y)}$ and $Si_zGe_{(1-z)}$ layers. The bottom DBR 36 can be doped p-type using, for example, Boron with a dopant concentration in an exemplary range of about $10^{18}$ to about $10^{19}$ atoms/cm$^3$. A top-most layer of $Si_yGe_{(1-y)}$ or $Si_zGe_{(1-z)}$ forms a nominally thicker cap layer 36A.

Disposed on the cap layer 36A is a strained Group III-V layer such as, in one non-limiting embodiment, an $In_{0.53}Ga_{0.47}As$ QW layer 38 that, in this embodiment, functions as a light absorption layer for the light incident on the top surface. The $In_{0.53}Ga_{0.47}As$ QW layer 38 can have a thickness in a range of about 2 nm to about 5 nm and a bandgap=0.75 eV. As was noted above for the VCSEL 10 embodiment of FIG. 2, other Group III-V materials and concentrations can be employed.

Disposed on a top surface of the light absorption layer 38 is a Group III-V surface passivation layer 40 that, in this non-limiting embodiment, is embodied as a relative thin (e.g., about 100 nm to about 300 nm) GaAs layer.

Disposed on a top surface of the Group III-V surface passivation layer 40 is, as one non-limiting example, the ITO/Al:ZnO electrically conductive oxide top DBR 42. Once again the index of refraction of the top DBR 42 is less than the index of refraction of the bottom DBR 36 and it can contain, for example, about 15 to about 25 pairs of ITO and Al:ZnO layers/Each of these layers can have a thickness in a range of about 150 nm to about 300 nm. There can be p-contacts 44 coupled to the bottom DBR 36 via the electrically conductive buffer layer 34 and n-contacts 46 coupled to the top DBR 42. One or both of the contacts 44, 46 could be ring-shaped contacts. The contacts 44 and 46 are connected during use to an operating voltage potential (e.g., a voltage in a range of about 0V to about −5V). During operation light received at the top surface having a wavelength in an exemplary range of about 1.3 μm~1.65 μm is absorbed in the, for example, strained $In_{0.53}Ga_{0.47}As$ QW layer 38 and generates detectable charge carriers. The combination of the layers 36A, 38 and 40, or at least layers 38 and 40, can be considered as embodying an intrinsic region in a P-I-N light absorbing photodetector diode.

As in the embodiment of FIG. 2 the bottom distributed feedback reflector (DBR) 36, composed of the alternating layers of $Si_yGe_{(1-z)}$, and $Si_zGe_{(1-z)}$, can exhibit a refractive index of, for example, Si:3.4 and $Si_{0.2}Ge_{0.8}$:4.1 and can have a refractive index contrast equal to 4.1/3.4=1.21. The bottom DBR composed of the alternating Group IV layers of $Si_yGe_{(1-y)}$ and $Si_zGe_{(1-z)}$ and the top ITO/AZO DBR 42 are both substantially transparent to light having a wavelength of interest, e.g., 1.3 μm~1.65 μm in this non-limiting example:

In the embodiments of this invention other types of layers/films can also be included, such as an anti-reflection (AR) coating (not shown) that can be disposed on the top surface of the device.

Figure 4:
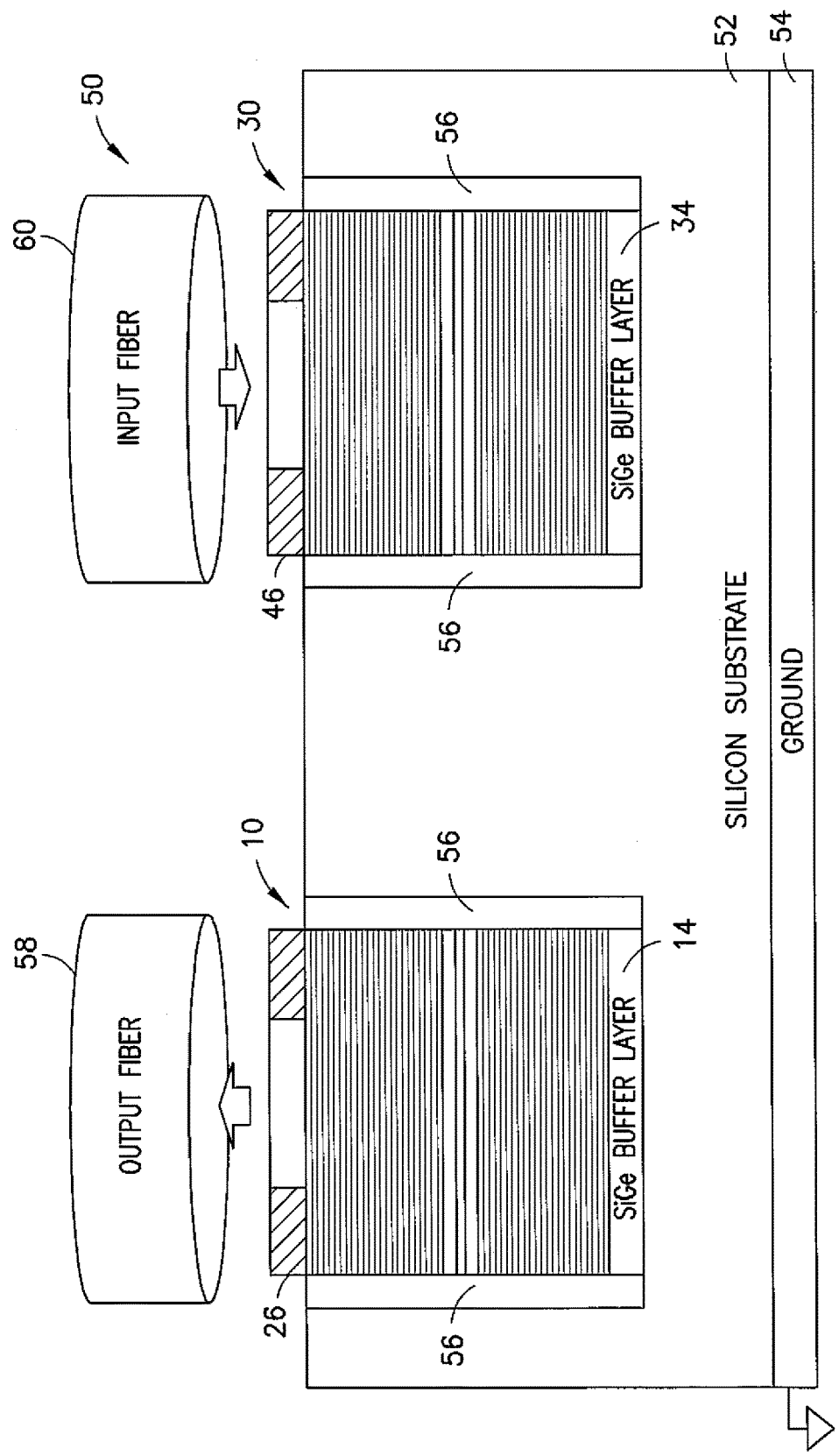

FIG. 4 shows an embodiment of an optoelectronic transmit/receive structure 50 that contains both the VCSEL 10 as in FIG. 2 and the resonant cavity PD 30 as in FIG. 3. The VCSEL 10 and the PD 30 share a common Si substrate 52 and can share a common backside electrical contact 54, typically a ground potential contact. The VCSEL 10 and the PD 30 are each fabricated within an aperture or well that is wet or dry etched into the substrate 52 and that is lined with a dielectric spacer 56 (e.g., a nitride or an oxide having a thickness in a range of about 10 nm to about 200 nm) to provide electrical isolation of the VCSEL 10 and the PD 30 from the grounded substrate 10. The buffer layers 14 and 34 (e.g., $Si_xGe_{1-x}$, buffer layers, where 0.5<x<0.7) can be deposited on a bottom surface of their respective wells followed by the epitaxial growth of the overlying layers of the bottom Group IV DBRs 16, 36, the strained Group III-V, e.g., $In_{0.53}Ga_{0.47}As$, light emitting/light absorbing layers 18, 38 and associated GaAs passivation layers 20, 40, and the overlying ITO/Al:ZnO electrically conductive oxide top DBRs 22, 42. The annular ring-type contacts 26 and 46 can then be deposited to provide electrical top-side connections to the embedded VCSEL 10 and PD 30. During use the optoelectronic transmit/receive structure 50 is optically coupled to an end of an output optical fiber 58 that receives, in this exemplary embodiment, the emitted 1.3 μm~1.65 μm light from the VCSEL 10 and to an end of an input optical fiber 60 that provides, in this exemplary embodiment, 1.3 μm~1.65 μm light to the PD 30.

In the embodiment of the optoelectronic transmit/receive structure 50 shown in FIG. 4 the fabrication of the VCSEL 10 and the PD 30 can be accomplished in parallel such as by the simultaneous deposition and growth of the various layers that are common to both devices.

It is pointed out that in addition to the VCSEL 10 and the PD 30 other devices and electronic circuitry including field-effect transistors, bipolar transistors, metal-oxide-semiconductor transistors, diodes, resistors, capacitors, inductors, etc., can be fabricated on or in the same common Si substrate 52. In addition, the Si substrate 52 can contain multiple VCSELs 10 and/or PDs 30 and these additional optoelectronic devices may all operate at the same wavelength or they may operate at different wavelengths. For example, linear or two dimensional arrays of VCSELs 10 and/or PDs 30 can be provided on the same common Si substrate 52 with additional support circuitry as needed.

Figure 5:
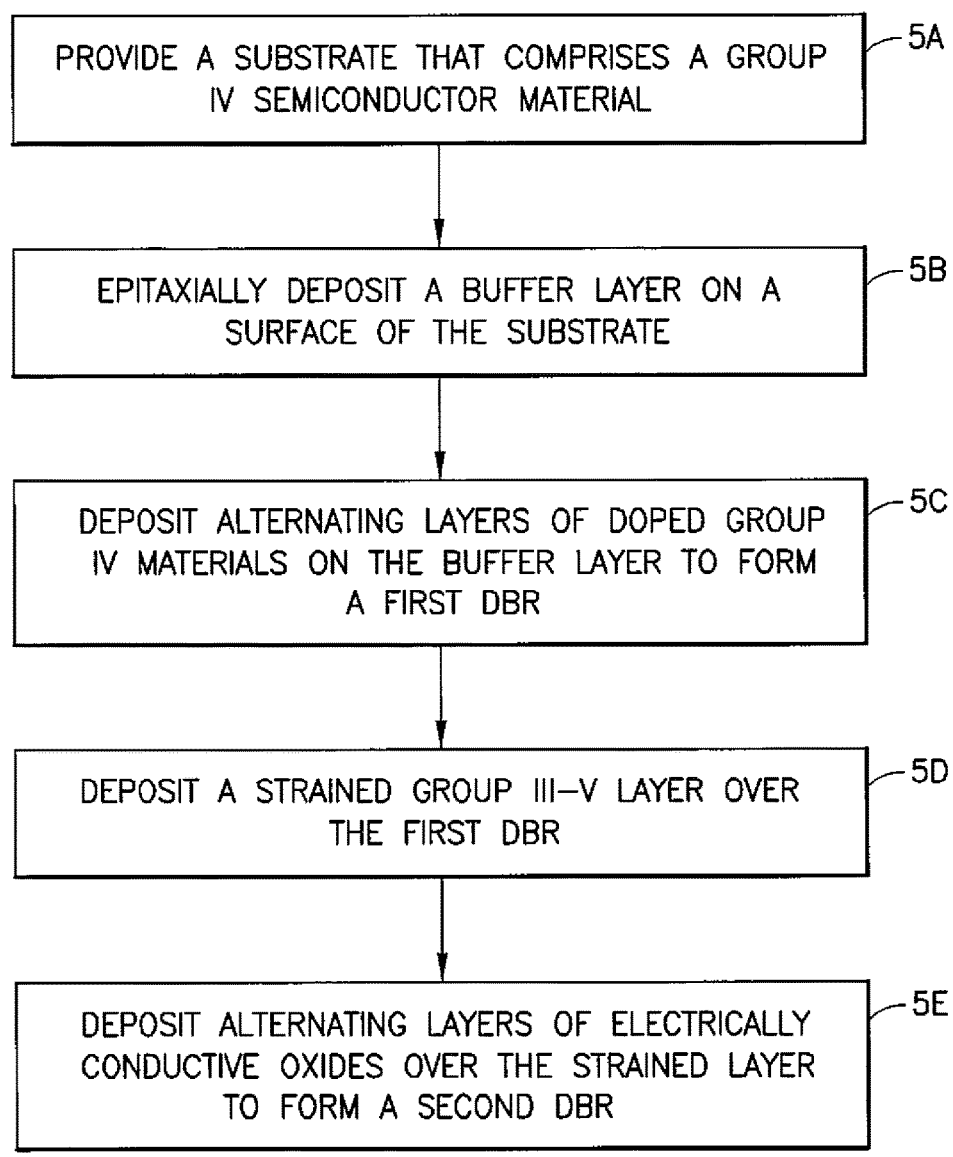
FIG. 5 is a fabrication flow diagram that is descriptive of a process to construct either the VCSEL of FIG. 2 or the resonant cavity PD of FIG. 3.

FIG. 5 is a fabrication flow diagram that is descriptive of a process to construct either the VCSEL 10 of FIG. 2 or the resonant cavity PD 30 of FIG. 3 (or both in the embodiment of FIG. 4). A first step 5A provides a substrate that comprises a Group IV semiconductor material. A second step 5B epitaxially deposits a buffer layer on a surface of the substrate. A next step 5C deposits alternating layers of doped Group IV materials on the buffer layer to form a first DBR on the buffer layer. A next step 5D deposits a strained layer comprised of a Group III-V material over the first DBR. A further step 5E deposits alternating layers of electrically conductive oxides over the strained layer to form a second DBR over the strained layer.

In the method the step of depositing the strained layer comprises an additional step of depositing a Group III-V passivation layer on the strained layer, and the step of depositing alternating layers of electrically conductive oxides deposits them on the Group III-V passivation layer.

In one non-limiting embodiment of the method the substrate is comprised of Si, epitaxially depositing the buffer layer deposits a relaxed SiGe layer, such as a $Si_xGe_{1-x}$ layer, where $0.5<x<0.7$, having a thickness in a range of about 100 nm to about 1000 nm, and depositing alternating layers of doped Group IV materials on the buffer layer deposits alternating Group IV layers of $Si_yGe_{(1-y)}$, where $0.8<y<1$, and $Si_zGe_{(1-z)}$, where $0.2<z<0.4$, where each layer has a thickness in a range of about 80 nm to about 150 nm and where there about 20 to about 35 pairs of the alternating Group IV layers of $Si_yGe_{(1-y)}$ and $Si_zGe_{(1-z)}$ that are deposited. In this non-limiting embodiment of the method the step of depositing alternating layers of electrically conductive oxides over the strained layer deposits alternating layers of Indium Tin Oxide (ITO) and Aluminum doped Zinc Oxide (AZO), where each layer of ITO and AZO has a thickness in a range of about 150 nm to about 300 nm and where there about 15 to about 25 pairs of the ITO and AZO layers that are deposited. In this non-limiting embodiment of the method the wavelength of interest is in a range of about 1.3 μm~1.65 μm and where depositing the strained layer comprised of a Group III-V material deposits a layer of strained InGaAs, such as but not limited to a layer of $In_{0.53}Ga_{0.47}As$, having a thickness in a range of about 2 nm to about 5 nm.

An integrated circuit in accordance with the present invention can be employed in applications, hardware, and/or electronic systems. Suitable hardware and systems in which such integrated circuits can be incorporated include, but are not limited to, personal computers, communication networks, electronic commerce systems, portable communications devices (e.g., cell phones), solid-state media storage devices, functional circuitry, etc. Systems and hardware incorporating such integrated circuits are considered part of this invention. Given the teachings of the invention provided herein, one of ordinary skill in the art will be able to contemplate other implementations and applications of the techniques of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

As such, various modifications and adaptations may become apparent to those skilled in the relevant arts in view of the foregoing description, when read in conjunction with the accompanying drawings and the appended claims. As but some examples, the use of other similar or equivalent semiconductor fabrication processes, including deposition processes, etching processes may be used by those skilled in the art. Further, the exemplary embodiments are not intended to be limited to only those materials, metals, insulators, dopants, dopant concentrations, layer thicknesses and the like that were specifically disclosed above. Any and all such and similar modifications of the teachings of this invention will still fall within the scope of this invention.

What is claimed is:

1. A structure comprising an optoelectronic device, comprising:
   a substrate that comprises a Group IV semiconductor material;
   a buffer layer disposed on the substrate;
   a first distributed Bragg reflector (DBR) disposed on the buffer layer, the first DBR comprised of alternating layers of doped Group IV materials that are substantially transparent to a wavelength of interest;
   a strained layer disposed over the first DBR, the strained layer being comprised of a Group III-V material; and
   a second DBR disposed over the strained layer, the second DBR comprised of alternating layers of electrically conductive oxides that are substantially transparent to the wavelength of interest;
   where the first DBR is comprised of alternating layers of p-type doped $Si_yGe_{(1-y)}$, where $0.8<y<1$, and $Si_zGe_{(1-z)}$, where $0.2<z<0.4$, where each layer has a thickness in a range of about 80 nm to about 150 nm and where there about 20 to about 35 pairs of the alternating layers of $Si_yGe_{(1-y)}$ and $Si_zGe_{(1-z)}$.

2. The structure as in claim 1, where the first DBR is comprised of alternating layers of doped Si and SiGe.

3. The structure as in claim 1, where the first DBR is comprised of alternating Group IV layers of $Si_yGe_{(1-y)}$, where $0.8<y<1$, and $Si_zGe_{(1-z)}$, where $0.2<z<0.4$.

4. The structure as in claim 1, where the second DBR is comprised of alternating layers of Indium Tin Oxide (ITO) and Aluminum doped Zinc Oxide (AZO).

5. The structure as in claim 1, where the second DBR is comprised of alternating layers of Indium Tin Oxide (ITO) and Aluminum doped Zinc Oxide (AZO), where each layer has a thickness in a range of about 150 nm to about 300 nm and where there about 15 to about 25 pairs of the ITO and AZO layers.

6. The structure as in claim 1, where the substrate is comprised of Si, and where the buffer layer is comprised of SiGe.

7. The structure as in claim 1, where the substrate is comprised of Si, and where the buffer layer is comprised of a relaxed $Si_xGe_{1-x}$ layer, where $0.5<x<0.7$, having a thickness in a range of about 100 nm to about 1000 nm.

8. The structure as in claim 1, where the strained layer comprised of a Group III-V material has a thickness in a range of about 2 nm to about 5 nm.

9. The structure as in claim 1, where the strained layer comprised of a Group III-V material is a light emitting layer at the wavelength of interest and has a thickness in a range of about 2 nm to about 5 nm.

10. The structure as in claim 1, where the strained layer comprised of a Group III-V material is a light absorbing layer at the wavelength of interest and has a thickness in a range of about 2 nm to about 5 nm.

11. The structure as in claim 1, where the wavelength of interest is in a wavelength range of about 1.3 μm to about 1.65 μm.

12. The structure as in claim 1, where the wavelength of interest is in a wavelength range of about 1.3 μm to about 1.65 μm, where the strained layer comprised of a Group III-V material is comprised of a strained $In_{0.53}Ga_{0.47}As$ light emitting layer at the wavelength of interest having a thickness in a range of about 2 nm to about 5 nm.

13. The structure as in claim 1, where the wavelength of interest is in a wavelength range of about 1.3 μm to about 1.65 μm, where the strained layer comprised of a Group III-V material is comprised of a strained $In_{0.53}Ga_{0.47}As$ light absorbing layer at the wavelength of interest having a thickness in a range of about 2 nm to about 5 nm.

14. The structure as in claim 1, where the optoelectronic device is a first optoelectronic device that emits light at the wavelength of interest, where the structure comprises at least one second optoelectronic device that absorbs light at the wavelength of interest, and where the substrate is common to both the first optoelectronic device and to the at least one second optoelectronic device.

15. The structure as in claim 14, where the first optoelectronic device comprises a first p-contact and where the at least one second optoelectronic device comprises a second p-contact, the first p-contact and the second p-contact each being disposed on the second DBR of each of the first optoelectronic device and the at least one second optoelectronic device.

16. The structure as in claim 15, where the first p-contact and the second p-contact are each annular in structure.

17. The structure as in claim 14, where the first optoelectronic device and the at least one second optoelectronic device share a common backside electrical contact.

18. The structure as in claim 14, where the first optoelectronic device and the at least one second optoelectronic device are each disposed within a well in the substrate, each well being lined with a dielectric spacer.

19. The structure as in claim 18, where the dielectric spacer in each well comprises one of a nitride and an oxide and has a thickness in a range of about 10 nm to about 200 nm.

20. A structure comprising an optoelectronic device, comprising:
a substrate that comprises a Group IV semiconductor material;
a buffer layer disposed on the substrate;
a first distributed Bragg reflector (DBR) disposed on the buffer layer, the first DBR comprised of alternating layers of doped Group IV materials that are substantially transparent to a wavelength of interest;
a strained layer disposed over the first DBR, the strained layer being comprised of a Group III-V material; and
a second DBR disposed over the strained layer, the second DBR comprised of alternating layers of electrically conductive oxides that are substantially transparent to the wavelength of interest;
where the second DBR is comprised of alternating layers of Indium Tin Oxide (ITO) and Aluminum doped Zinc Oxide (AZO), where each layer has a thickness in a range of about 150 nm to about 300 nm and where there about 15 to about 25 pairs of the ITO and AZO layers.

* * * * *